United States Patent [19]

Kakinuma et al.

[11] Patent Number: 4,533,564

[45] Date of Patent: Aug. 6, 1985

[54] METHOD OF MANUFACTURING AN ELECTROPHOTOGRAPHIC PHOTORECEPTOR

[75] Inventors: Hiroaki Kakinuma; Mamoru Yoshida; Satoshi Nishikawa, all of Tokyo, Japan

[73] Assignee: Oki Electric Industry Co., Ltd., Tokyo, Japan

[21] Appl. No.: 645,139

[22] Filed: Aug. 28, 1984

[30] Foreign Application Priority Data

Sep. 7, 1983 [JP] Japan .................................. 58-163174
Sep. 28, 1983 [JP] Japan .................................. 58-179886

[51] Int. Cl.$^3$ .............................................. B05D 3/06
[52] U.S. Cl. ........................................ 427/39; 427/74; 427/255.2; 427/255.7
[58] Field of Search .............. 427/39, 74, 255.2, 255.7

[56] References Cited

PUBLICATIONS

Schiff et al. "A Doping-Precipitated Morphology in Plasma-Deposited a-Si:H"; Appl. Phys. Lett., vol. 38, No. 2, Jan. 15, 1981, pp. 92-94.
Oda et al. "The Residual Voltage in Fast Electrophotography of a-SiH$_x$"; Solar Energy Materials 8, 1982, pp. 123-128.

Primary Examiner—Bernard D. Pianalto
Attorney, Agent, or Firm—Pollock, Vande Sande & Priddy

[57] ABSTRACT

A method of manufacturing an electrophotographic photoreceptor for use in a copying apparatus or a printer is disclosed. The method comprises steps of providing an electrically conductive substrate, providing a first layer provided on the substrate for preventing injection of electrons into the photoreceptor from the substrate, providing a second layer of amorphous silicon provided on the first layer for determining charging characteristic of photoreceptor and providing a third layer for preventing injection of holes into the photoreceptor from the surface thereof and for effecting passivation of the surface. The second layer is subjected to doping of boron, which is effected by introducing a mixed gas of boron and silicon with a ratio of 0.2-2 ppm into a growth chamber.

7 Claims, 5 Drawing Figures

FIG_1
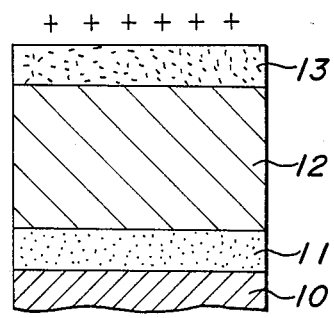
FIG_2
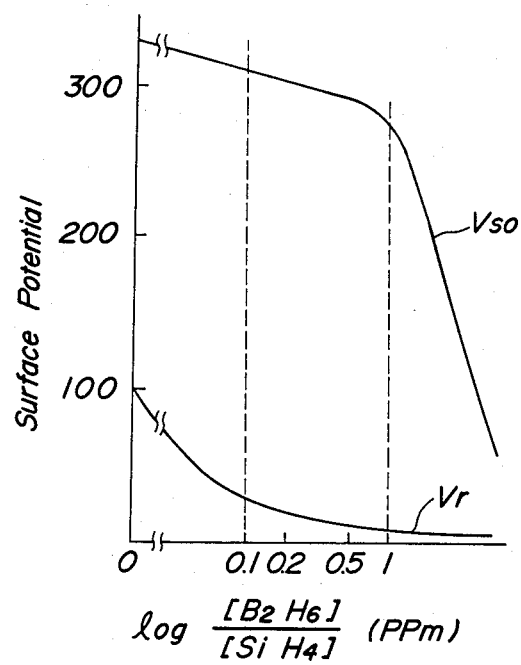

METHOD OF MANUFACTURING AN ELECTROPHOTOGRAPHIC PHOTORECEPTOR

BACKGROUND OF THE INVENTION

The present invention relates to a method of manufacturing an electrophotographic photoreceptor, more particularly to a method of manufacturing a photoreceptor of amorphous silicon having low residual voltage or potential and high charging characteristic or capability.

The electrophotographic photoreceptor for use in a copying apparatus or a printer untilizes Se-Te, $Se_2As_3$, ZnO or other inorganic materials. These materials, particularly Se system are suitable only at wavelengths in the range of below 650–700 nm and are deteriorated at 50° C.

In order to improve these defects the photoreceptor of amorphous silicon (hereinafter referred to as a-Si) has been developed. Such an a-Si has high sensitivity at longer wavelength and is hard, stable at a temperature of about 200° C. and not toxic, so a-Si is suitable for use in the photoreceptor. This photoreceptor consists of only one a-Si layer provided on a base layer. The a-Si layer is generally formed by glow discharge decomposition of monosilane ($SiH_4$) and has low resistivity such as $10^{10}$ Ωcm or less so that charges cannot be held at the surface of the photoreceptor.

In order to obtain necessary charging characteristic or capability of the photoreceptor there is utilized a method of making the a-Si layer high resistivity by doping of oxygen or nitrogen. However, in this method, it is difficult to control the doping concentration of oxygen or nitrogen for obtaining an optimum resistivity.

Accordingly, there is utilized another method of preventing injection of charges into the a-Si layer as the sensitized layer from the surface thereof and the substrate by providing at the interface with the substrate or the surface of the a-Si layer a layer of high resistive material such as a-SiC, $a-SiN_x$, $a-SiO_x$ or a a-Si layer of n or p conductivity type according to negative or positive surface charges. According to the latter method, the photoreceptor consists of multilayers on the base layer and the charge preventing layer has a thickness of few hundreds Å to few μm.

In the above latter method two conditions are required to the intermediate a-Si layer serving as the sensitized layer; firstly when no light is incident on the photoreceptor, slight thermal carriers are generated and dark decay time is long. Secondly when light is incident on the photoreceptor, it is necessary to transport the generated photo carriers to the interface as soon as possible without capturing them on the way. When the a-Si layer or film is formed by plasma CVD (glow discharge process), however, the first and second conditions are incompatible with each other, since in case of utilizing the a-Si layer as an electrophotographic photoreceptor, its thickness is made 20 μm or more in order to obtain a sufficient charging characteristic resulting in a necessity of growing the a-Si layer at a high rate (~10 μm/h or more) so that a large number of defects such as trapping level, dangling bond, microvoids or the like due to $SiH_n$ (n=2, 3) are caused as compared with the a-Si layer formed with low rate which is utilized in a solar cell or photo sensor. As a result, the first condition is satisfied but the second condition does not satisfy. In the case of a positive charging system, particularly, if a deep trapping level, for holes is present in the a-Si layer holes trapped at the deep level find difficulty in reexciting due to heat and this becomes a cause of high residual potential.

SUMMARY OF THE INVENTION

It is an object of the present invention to overcome the above disadvantages of conventional electrophotographic photoreceptor.

It is another object of the present invention to provide a method of manufacturing an electrophotographic photoreceptor in which low residual voltage or potential and high charging characteristic are obtained by doping a slight amount of boron into the amorphous silicon layer.

The present invention is based on the recognition that when the potential difference between the initial surface potential and the residual potential of the photoreceptor becomes large the printing property becomes suitable.

According to the present invention there is provided a method of manufacturing an electrophotographic photoreceptor comprising an electrically conductive substrate, a first layer provided on the substrate for preventing injection of electrons into the photoreceptor from the substrate, a second layer of amorphous silicon provided on the first layer for determining charging characteristic of the photoreceptor, a third layer provided on the second layer for preventing injection of holes into the photoreceptor from the surface thereof and for effecting passivation of the surface, and the second layer being subjected to doping of boron, which is effected by introducing a mixed gas of boron and silicon with a ratio of 0.2–2 ppm into a growth chamber.

The first, second and third layers are continuously grown in one and the same growth chamber by CVD process and following growth conditions are utilized:
  substrate temperature: 150°–300° C.
  atmospheric pressure: 50–400 Pa
  RF power: 200–700 W
  gas flow rate: 100–700 SCCM
whereby the second layer is grown at high rate of 10 μm/h or more and the first and third layers are grown at low rate.

BRIEF DESCRIPTION OF THE DRAWING

These and other features and advantages of the present invention will become readily apparent from the following detailed description of one embodiment of the present invention, particularly, when taken in connection with the accompanying drawings, and wherein:

FIG. 1 is a sectional view showing construction of an amorphous silicon photoreceptor of charge prevention type, FIG. 2 is a characteristic view showing a relation between doping amount of boron and initial surface potential (Vso) and residual potention (Vr)

DESCRIPTION OF THE PREFERRED EMBODIMENT

Figure 3:
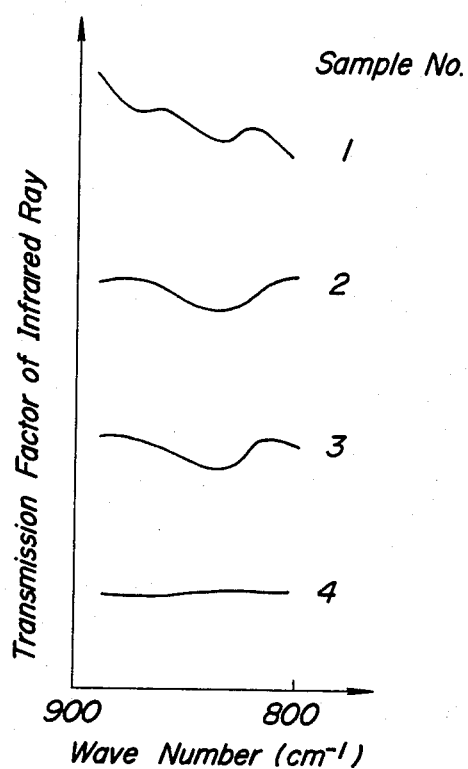
FIG. 3 is a diagram showing absorption of p conductivity type amorphous silicon layer or film at wave number of 840 $cm^{-1}$.

Referring now to the drawings, there is shown an embodiment of a method of manufacturing an electrophotographic photoreceptor according to the present invention.

FIG. 1 is a sectional view showing an electrophotographic photoreceptor manufactured by the method according to the present invention. The photoreceptor is an amorphous silicon (a-Si) photoreceptor of charge prevention type in positive charging system. As shown in FIG. 1 the photoreceptor comprises an electrically conductive substrate 10, a first layer 11 provided on the substrate 10 for preventing injection of electrons into the photoreceptor from the substrate, a second layer 12 of amorphous silicon provided on the first layer for determining charging characteristic of the photoreceptor and a third layer 13 provided on the second layer for preventing injection of holes into the photoreceptor from the surface thereof and for effecting passivation of the surface. In this invention, these first, second and third layers are continuously grown in one and the same growth chamber (glow discharge chamber).

The first layer 11 serves to prevent injection of electrons into the photoreceptor from the substrate 10 and is formed by an amorphous silicon (a-Si) of p conductivity type with a thickness of about 0.5 $\mu$m. The substrate 10 may be formed by aluminum or by an insulator with an electrically conductive coating. The manufacture of the first layer is as follows. The amorphous silicon of the first layer 11 is grown on the substrate 10 at the temperature of 250° C. in a plasma CVD apparatus of capacitive coupling type (not shown) by introducing monosilane ($SiH_4$) and diborane ($B_2H_6$) as raw gas materials with a ratio of $B_2H_6/SiH_4 \simeq 100$ ppm. As to samples Nos. 1 to 4 of four amorphous silicon layers grown on the substrate by changing combination of growth conditions, that is, $SiH_4$ flow rate, RF power and atmospheric pressure, the growth rate, presence of infrared absorption due to $(SiH_2)_n$ at wave number of 840 cm$^{-1}$, and adhesive power to the substrate are investigated and shown in an appendix table I. The tested data as to presence of absorption at 840 cm$^{-1}$ for each sample are shown in FIG. 3 in which wave number (cm$^{-1}$) is plotted on the abscissa and transmission factor of infrared ray is plotted on the ordinate.

As seen from FIG. 3 and the table I, if $SiH_4$ gas flow rate and atmospheric pressure are made small and RF power is made large, there is no absorption at 840 cm$^{-1}$ and adhesive power becomes large. If gas flow rate and atmospheric pressure are made extremely small, growth rate becomes decreased and is no practical use.

Figure 4:
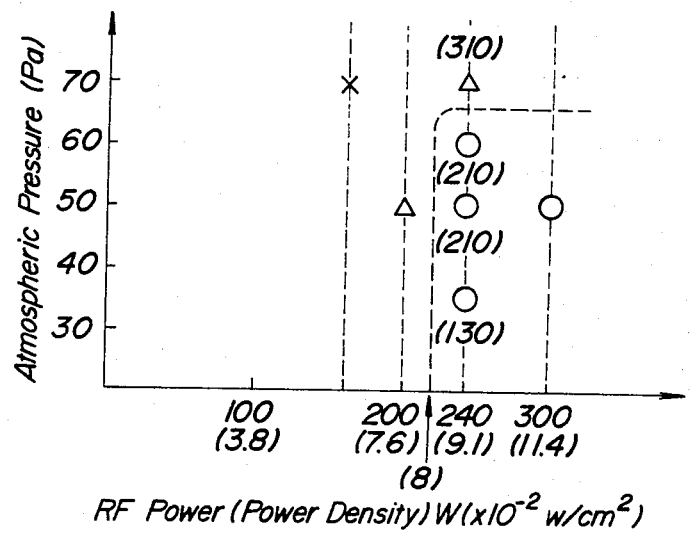
FIG. 4 is a diagram showing exfoliation states of the amorphous silicon film at different conditions of atmospheric pressures and RF powers.

The exfoliation states of amorphous silicon film grown on the substrate at various combinations of conditions of atmospheric pressures and RF powers are shown in FIG. 4 in which atmospheric pressure is plotted on the ordinate and RF power is plotted on the abscissa. On the abscissa upper number shows RF power (W) and lower number in the parenthesis indicates power density (W $\times 10^{-2}$ W/cm$^2$). In FIG. 4 mark X shows exfoliated film, mark $\triangle$ designates exfoliated film in part, and mark O indicates good film with no exfoliation. The number in the parenthesis in the drawing of FIG. 4 shows growth rate (Å/M). As seen from FIG. 4 there is necessary the atmospheric pressure of 65 Pa or less and the RF power of 210 W ($8 \times 10^{-2}$ W/cm$^2$) or more in order to obtain good adhesive power.

The third layer 13 serves to prevent injection of holes in the photoreceptor from the surface thereof and to make the surface passivative and consists of a-SiC layer with a thickness of about 0.1 $\mu$m. The layer 13 may be formed by a-SiN$_x$ or a-SiO$_x$.

The second layer or intermediate layer 12 consists of amorphous silicon (a-Si) layer with a thickness of about 20 $\mu$m which is formed by introducing in the glow discharge chamber (not shown) gas of diborane ($B_2H_6$) and monosilane ($SiH_4$) with gas ratio ($B_2H_6/SiH_4$) of about 0.4 ppm and hence a ratio (B/Si) of about 0.8 ppm.

The initial surface potential or voltage of the electrophotographic photoreceptor thus formed is about 300 volts. In this case the corona discharge voltage is $+7$ kV. This voltage is substantially the same as the initial surface voltage (about 330 volts) of the receptor in which boron is not doped. The residual potential of the photoreceptor with doped boron is about 20 volts. In this case incident wavelength is 650 nm. This residual voltage is remarkably lower than that (about 100 volts) of the photoreceptor in which boron is not doped.

FIG. 2 shows relation between the initial surface potential (Vso) and the residual potential (Vr) with respect to gas ratio of the introduced gas of $B_2H_6$ and $SiH_4$. Even though different from the film property of the second layer, if this gas ratio is within the range of 0.1 to 1 ppm (ratio of B and Si is 0.2 to 2 ppm) the initial surface potential is slightly decreased as compared with the initial surface potential of the photoreceptor in which boron is not doped, and the residual potential may be substantially decreased so that the gas ratio of $B_2H_6$ and $SiH_4$ of 0.2 to 0.5 ppm (ratio of B and Si of 0.4 to 1 ppm) is a preferable range.

Figure 5:
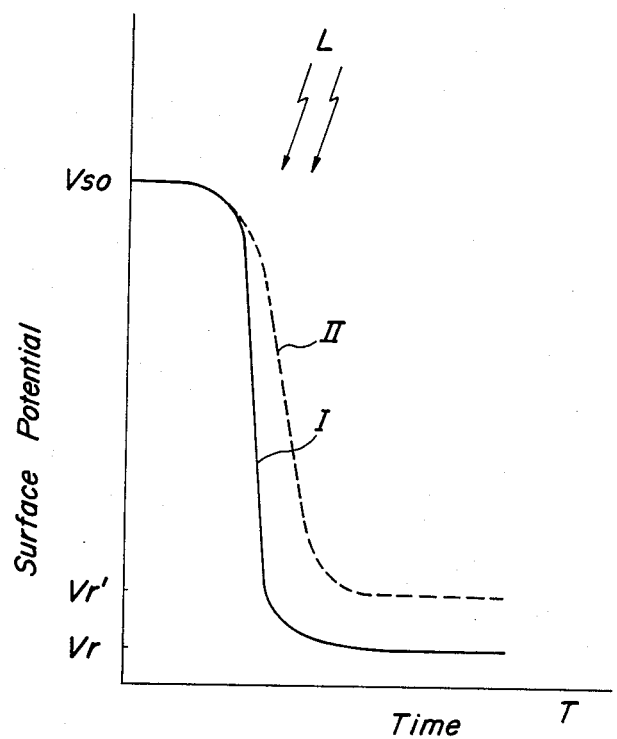
FIG. 5 is an explanatory view showing the charging characteristic of the photoreceptor according to the present invention.

FIG. 5 shows characteristic curve I of the photoreceptor according to the present invention and that II of the photoreceptor in which no boron is doped. In FIG. 5, a surface potential is plotted on the ordinate and time is plotted on the abscissa. As is apparent from the curves I and II shown in FIG. 5, when the photoreceptor of the present invention is irradiated by the light L, the surface potential thereof drops suddenly from its initial potential Vso to the lower residual voltage Vr. To the contrary, the surface potential of the photoreceptor with no boron doping drops slowly from its initial potential Vso to the residual voltage Vr' which is remarkably higher than that Vr of the photoreceptor of the present invention. Therefore, the surface potential difference between initial surface potential Vso and the residual potential Vr becomes larger than the conventional photoreceptor and, hence, the printing property becomes suitable and apparent sensitivity of the photoreceptor is lowered.

According to the present invention the residual potential of the photoreceptor can be remarkably decreased without decreasing the initial surface potential by doping suitable amount of boron into the intermediate amorphous silicon layer.

TABLE I

| SAMPLE NO. | GAS FLOW RATE SCCM | RF POWER W | ATMOSPHERIC PRESSURE Pa | GROWTH RATE Å/M | PRESENCE OF ABSORPTION AT 840 cm$^{-1}$ | ADHESIVE POWER |
| --- | --- | --- | --- | --- | --- | --- |
| 1 | 250~350 | 240 | 70 | 630 | YES | EXFOLIATION |
| 2 | 100~200 | 160 | 70 | 350 | YES | EXFOLIATION |
| 3 | 100~200 | 240 | 70 | 310 | YES | EXFOLIATION IN PART |
| 4 | 100~200 | 240 | 50 | 210 | NO | GOOD |

What is claimed is:

1. In a method of manufacturing an electrophotographic photoreceptor which is utilized in positive charging system having an electrically conductive substrate, a first layer provided on the substrate for preventing injection of electrons into the photoreceptor from the substrate, a second layer of amorphous silicon provided on the first layer for determining charging characteristic of the photoreceptor and a third layer provided on the second layer for preventing injection of holes into the photoreceptor from the surface thereof and for effecting passivation of the surface, the improvement comprising the second layer being subjected to doping of boron, which is effected by introducing a mixed gas of boron and silicon with a ratio of 0.2-2 ppm into a growth chamber.

2. A method of manufacturing an electrophotographic photoreceptor as claimed in claim 1, wherein the first, second and third layers are continuously grown in one and the same growth chamber by CVD process and following growth conditions are utilized:
   substrate temperature: 150°-300° C.
   atmospheric pressure: 50-400 Pa
   RF power: 200-700 W
   gas flow rate: 100-700 SCCM
whereby the second layer is grown at high rate of 10 μm/h or more and the first and third layers are grown at low rate.

3. A method of manufacturing an electrophotographic photoreceptor as claimed in claim 2, wherein the growth chamber is a glow discharge chamber.

4. A method of manufacturing an electrophotographic photoreceptor as claimed in claim 1, wherein the substrate is formed by aluminum.

5. A method of manufacturing an electrophotographic photoreceptor as claimed in claim 1, wherein the substrate is formed by an insulator with an electrically conductive coating.

6. A method of manufacturing an electrophotographic photoreceptor as claimed in claim 1, wherein the first layer is amorphous silicon (a-Si) of p conductivity type.

7. A method of manufacturing an electrophotographic photoreceptor as claimed in claim 6, wherein the first layer is grown with the following growth condition:
   atmospheric pressure: 65 Pa or less
   RF power: 210 W or more.

* * * * *